United States Patent
Gidon et al.

(10) Patent No.: US 8,766,385 B2
(45) Date of Patent: Jul. 1, 2014

(54) FILTERING MATRIX STRUCTURE, ASSOCIATED IMAGE SENSOR AND 3D MAPPING DEVICE

(75) Inventors: Pierre Gidon, Echirolles (FR); Gilles Grand, Grenoble (FR); Laurent Frey, Fontaine (FR); Pascale Parrein, Fontaine (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 484 days.

(21) Appl. No.: 13/231,272

(22) Filed: Sep. 13, 2011

(65) Prior Publication Data
US 2012/0085944 A1   Apr. 12, 2012

Related U.S. Application Data

(63) Continuation-in-part of application No. 12/373,832, filed as application No. PCT/EP2007/057354 on Jul. 17, 2007, now Pat. No. 8,587,080.

(30) Foreign Application Priority Data

Jul. 25, 2006 (FR) ...................................... 06 53093

(51) Int. Cl.
*H01L 31/0232* (2014.01)
*H01L 21/00* (2006.01)

(52) U.S. Cl.
USPC .... 257/432; 257/431; 257/439; 257/E31.127; 257/E51.018; 257/294

(58) Field of Classification Search
USPC ................. 257/432, 431, 439, 440, 443, 444, 257/E31.127, E51.018, 291, 292, 294, 461
See application file for complete search history.

(56) References Cited

U.S. PATENT DOCUMENTS

| 6,262,830 | B1 | 7/2001 | Scalora |
| 8,410,528 | B2* | 4/2013 | Min .............................. 257/232 |
| 2004/0056180 | A1* | 3/2004 | Yu .............................. 250/214.1 |
| 2005/0003659 | A1 | 1/2005 | Markowitz et al. |
| 2005/0122417 | A1 | 6/2005 | Suzuki |
| 2006/0145223 | A1* | 7/2006 | Ryu .............................. 257/294 |
| 2007/0189625 | A1 | 8/2007 | Battiato et al. |

FOREIGN PATENT DOCUMENTS

| EP | 1 592 067 A1 | 11/2005 |
| JP | 01-271706 A | 10/1989 |
| JP | 04-053166 A | 6/1990 |

OTHER PUBLICATIONS

International Search Report for PCT/JP2007/057354 dated Nov. 9, 2007.

* cited by examiner

*Primary Examiner* — Cathy N Lam
(74) *Attorney, Agent, or Firm* — Pearne & Gordon LLP (57) ABSTRACT

Filtering matrix structure comprising at least three color filters and a plurality of near Infrared filters, each one of the color filters and the near Infrared filters having an optimum transmission frequency, wherein the filtering matrix structure is made of n metal layers (m1, m2, m3) and n substantially transparent layers (d1, d2, d3) which alternate between a first metal layer (m1) and an $n^{th}$ substantially transparent layer (d3), each of the n metal layers (m1, m2, m3) having a constant thickness and at least one substantially transparent layer having a variable thickness which sets the optimum transmission frequency of each color filter and each near Infrared filter, n being an integer larger than or equal to 2. Application to 3D mapping and imaging.

16 Claims, 6 Drawing Sheets

FILTERING MATRIX STRUCTURE, ASSOCIATED IMAGE SENSOR AND 3D MAPPING DEVICE

TECHNICAL FIELD AND PRIOR ART

The present invention is a continuation-in-part application of patent application Ser. No. 12/373,832 filed on Jan. 14, 2009.

The invention relates to a filtering matrix structure.

The invention also relates to an image sensor which comprises a filtering matrix structure according to the invention and to a three-dimensional (3D) mapping and imaging device intended to generate a 3D profile of the surface of an object.

The invention finds a particular advantageous application for producing image sensors and 3D mapping and imaging devices of small size.

Obtaining images by an electronic sensor is in full development. The demand for simplification of the production of the sensors continues to be very strong. Charge coupled devices, more commonly called CCD sensors, are gradually replaced with active pixel sensors in CMOS technology, more commonly called CMOS APS (Active Pixel Sensor) sensors.

One of the important problems to be solved for an image sensor is that of obtaining colors. It is known that starting with three colors taken from the visible spectrum (red, green, blue), it is possible to record and to then reproduce the majority of colors.

Certain pieces of equipment begin by separating the three color bands and then direct the latter towards three image sensors. Others separate the colors directly at the surface of a single matrix of detectors: this second type of sensors is the one to which relates the invention.

For this second sensor type, two options may be contemplated:
  either building a very complex detection matrix making use in several levels of its structure of the fact that the different colors do not penetrate the same depth in the material in which the conversion of photons into electrons is performed (photosite);
  or adding sets of filters positioned as a matrix at the surface of a matrix of detectors.

The second option (adding sets of filters positioned as a matrix to the surface of a matrix of detectors) is the one which is the most used. The most standard matrix is then a matrix commonly called a Bayer matrix.

Figure 1:
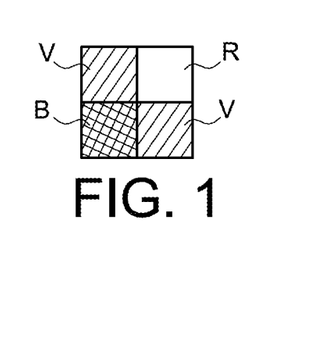
FIG. 1, already described, illustrates a top view of a Bayer matrix according to the prior art.

An example of a Bayer matrix, as seen from the top, is illustrated in FIG. 1. The Bayer matrix illustrated in FIG. 1 is a 2×2 (two lines×two columns) matrix. From left to right, the filters of the line of row 1 are green and red filters, respectively, and the filters of the line of row 2 are blue, green filters, respectively.

Producing such a filtering matrix is conventionally accomplished by using colored resins. In order to facilitate the production of the filtering matrix, one resorts to resins which are photosensitive to ultraviolet radiations, which may be removed in a developing bath there where they have not been insulated. For example, in order to produce a Bayer matrix according to the prior art, three layers of resin are successively deposited: one for green, one for red and one for blue. At each deposition, each of the resins is insulated through a mask and developed so that it only remains there where it should be placed.

Figure 2:
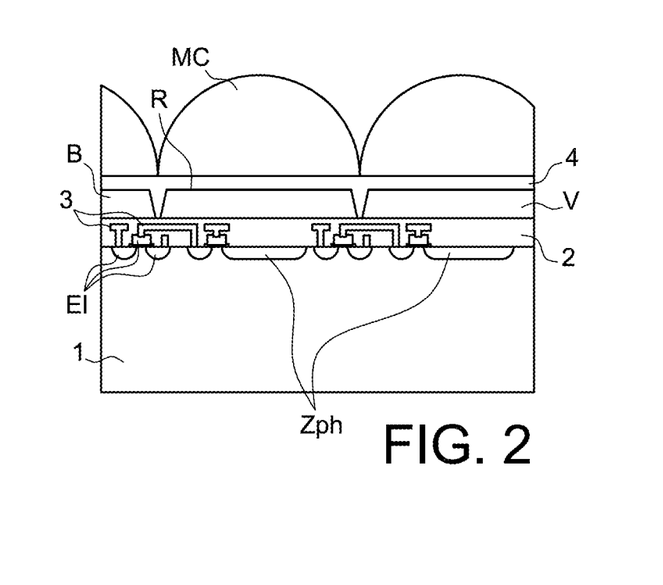
FIG. 2, already described, illustrates a sectional view of a CMOS APS sensor according to the prior art.

The diagram of FIG. 2 illustrates a simplified structure of an APS CMOS sensor from the prior art. The CMOS APS sensor comprises a photosensitive semiconducting element 1, for example silicon, at the surface of which are formed photosensitive areas Zph and electronic circuits E1, a silica layer 2 in which electric interconnections 3 are integrated, which connect together the electronic circuits E1, resin layers forming blue filters B, red filters R and green filters V, a layer of resin 4 and a set of micro-lenses MC.

This sensor making technique is presently well under control. A drawback of this sensor however is its impossibility of filtering infrared. It is therefore necessary to add afterwards above the sensor, a glass sheet provided with a multilayer interferential filter for removing infrared.

Moreover, the resins are not very dense and it is presently necessary to lay a thickness of resin close to or larger than one micron in order to obtain a sufficient filtering effect. The size of the pixels of recent image sensors is consequently close to this size (typically 2 µm). This pixel size then poses a problem when the rays arrive with strong incidence at the surface of the sensor (image edge or strongly open objective). Indeed, the photons allowed to pass through a filter may then finish their course in the photosite of the neighboring filter. This phenomenon therefore considerably limits miniaturization.

The colored resins are also known for being easily inhomogeneous. Filtering inhomogeneity is therefore all the more marked since the pixels are small. This also represents another drawback.

Moreover, there are absorbent materials other than resins but, if they may be more absorbent, these materials pose too many problems in producing them for being compatible with a simple production of a matrix of integrated photosites, which production then becomes too expensive.

DISCUSSION OF THE INVENTION

The invention does not have the drawbacks mentioned above.

Indeed, the invention relates to a filtering matrix structure comprising at least three different color filters and a plurality of near Infrared filters, each one of the different color filters and the near Infrared filters having an optimum transmission frequency, wherein the filtering matrix structure is made of n metal layers and n substantially transparent layers which alternate between a first metal layer and an $n^{th}$ substantially transparent layer, each of the n metal layers having a constant thickness and at least one substantially transparent layer having a variable thickness which sets the optimum transmission frequency of each color filter and each near Infrared filter, n being an integer larger than or equal to 2.

According to an additional feature of the invention, n=2 and a single substantial transparent layer has a variable thickness, the substantially transparent layer which has a variable thickness being the substantially transparent layer located between the first metal layer and a second metal layer.

According to another additional feature of the invention, n=3 and two substantially transparent layers have a variable thickness, a first substantially transparent layer which has a variable thickness being the substantially transparent layer located between the first metal layer and a second metal layer and the second substantially transparent layer which has a variable thickness being located between the second metal layer and a third metal layer, an overthickness resulting from a change in thickness of the first substantially transparent layer substantially stacked with an overthickness resulting from a change in thickness of the second substantially transparent layer.

According to yet another additional feature of the invention, the different color filters are Red, Green and Blue filters.

According to yet another feature of the invention, the Red, Green and Blue filters and the near Infrared filters are arranged in a form of a Bayer matrix wherein the near Infrared filters replace 50% of the Green filters.

According to yet another feature of the invention, the metal layers are in silver (Ag).

According to yet another feature of the invention, the material which makes up the substantially transparent layers is selected from titanium dioxide ($TiO_2$), indium-doped tin oxide (ITO), silica ($SiO_2$), silicon nitride ($Si_3N_4$), hafnium oxide ($HfO_2$), aluminium nitride (AlN) with or without doping materials (Cu, for example), silicon nitride ($Si_xN_y$).

The invention also relates to an image sensor comprising a filtering matrix structure and a photosensitive semiconducting substrate on which is deposited the filtering matrix structure, wherein the filtering matrix structure is a structure according to the invention, the first metal layer being deposited on a first face of the photosensitive semiconducting substrate.

According to another feature of the invention, photosensitive areas and electronic components are formed on the first face of the photosensitive semiconducting substrate.

According to yet another feature of the invention, photosensitive areas and electronic components are formed on a second face of the photosensitive semiconducting substrate opposite to the first face.

The invention also relates to an image sensor comprising a filtering matrix structure according to the invention, a photosensitive semiconducting substrate and a barrier layer, a first face of the barrier layer being in contact with the first metal layer and a second face of the barrier layer opposite to the first face being in contact with a face of the photosensitive substrate.

According to another feature of the invention, the barrier layer is made in a material identical with the material which makes up the substantially transparent layers of the filtering matrix structure.

According to yet another feature of the invention, the barrier layer is partly or totally electrically conducting.

According to yet another feature of the invention, the material of the barrier layer is indium-doped tin oxide (ITO) in the electrically conducting portions and silica ($SiO_2$) or silicon nitride ($Si_3N_4$) in the portions which are not electrically conducting.

The invention also relates to an image sensor comprising a filtering matrix structure according to the invention, a photosensitive semiconducting substrate and a dielectric layer, a first face of the dielectric layer being in contact with the first metal layer and a second face of the dielectric layer opposite to the first face being in contact with a face of the photosensitive substrate.

The invention also relates to a 3D mapping and imaging device comprising a near Infrared source emitting a near Infrared light, a device for producing patterned or structured light through which the near Infrared light passes before reaching an object, and an image sensor configured to capture both some visible light reflected by the object and some near Infrared light reflected by the object, wherein the image sensor is an image sensor according to the invention.

Multilayer filters consisting of an alternation of transparent layers and of metal layers are known for making structures with a photonic forbidden band, more commonly called PBG (Photonic Band Gap) structures. U.S. Pat. No. 6,262,830 discloses metal-dielectric transparent structures with a photonic forbidden band.

The metal-dielectric transparent structures with a photonic forbidden band disclosed in U.S. Pat. No. 6,262,830 consist of the superposition of a plurality of transparent dielectric layers with a thickness close to one half-wavelength separated by thin metal layers. The thickness of each dielectric or metal layer is uniform. These structures are designed in order to let through certain frequency bands and to block other ones. A drawback of these structures is that they absorb a portion of the light, including in the areas where it would be desired that they be transparent.

The filtering matrix structure of the invention is made from such a metal-dielectric transparent structure with a photonic forbidden band. Indeed, in an unexpected way for one skilled in the art, the filtering matrix structure of the invention is made by a change in the thickness of only one or two transparent layers of a metal-dielectric transparent structure with a photonic forbidden band, whereas, moreover, all the other layers are of constant thickness. As seen in a sectional view, the transparent layer(s) with variable thickness vary stepwise depending on their position in the matrix.

Advantageously, a filtering matrix structure according to the invention may be such that all the elementary filters thicknesses (color filters and near Infrared filters) are smaller than the shortest of the useful wavelengths.

SHORT DESCRIPTION OF THE FIGURES

Other characteristics and advantages of the invention will become apparent upon reading preferential embodiments of the invention made with reference to the appended figures, wherein.

In all the figures, the same references designate the same elements.

DETAILED DESCRIPTION OF EMBODIMENTS OF THE INVENTION

Figure 3:
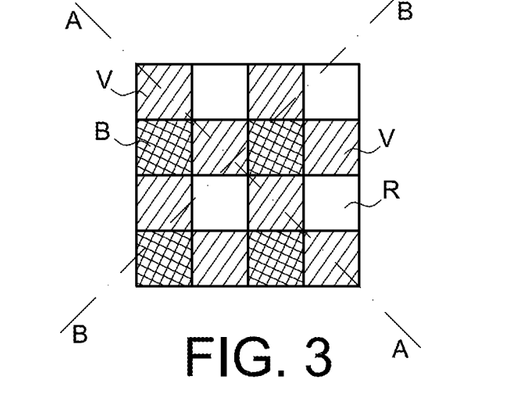
FIG. 3 illustrates a top view of an optical filtering matrix structure according to the invention described in patent application Ser. No. 12/373,832.

FIG. 3 illustrates a top view of an optical filtering matrix structure according to the invention described in patent application Ser. No. 12/373,832. As seen from above, the optical filtering matrix structure has a geometry obtained by repeating the basic structure from the prior art illustrated in FIG. 1. Filtering cells R, V, B for selecting the colors red, green and blue, respectively, are placed one beside another.

Figure 4A:
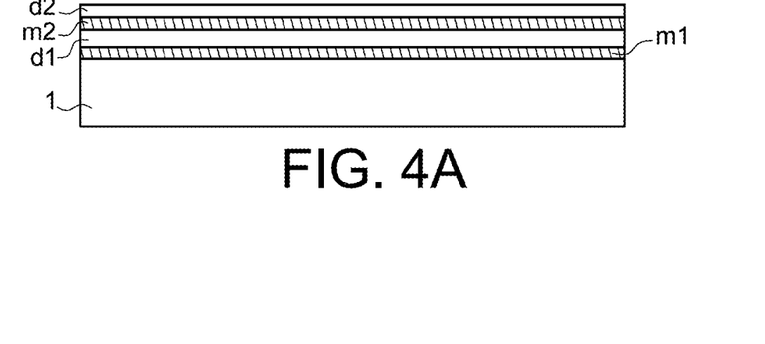
FIGS. 4A and 4B illustrate sectional views along two different axes of an optical filtering matrix structure according to a first embodiment of the invention described in patent application Ser. No. 12/373,832.
Figure 4B:
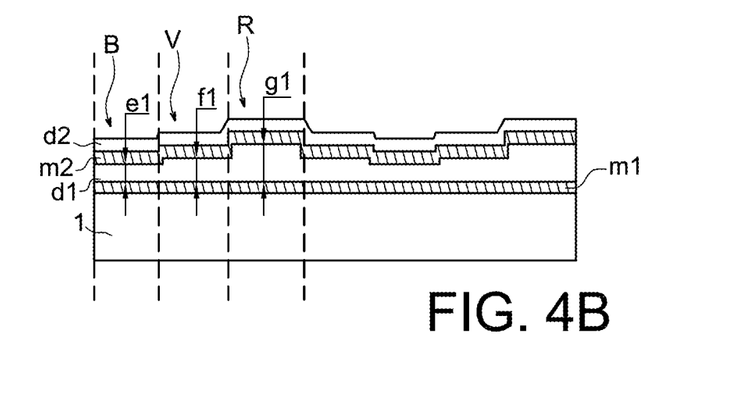

FIGS. 4A and 4B illustrate sectional views, along two different axes, of an optical filtering matrix structure according to a first embodiment of the invention described in patent application Ser. No. 12/373,832. With reference to FIG. 3, FIG. 4A is a sectional view along the axis AA of FIG. 3 and FIG. 4B is the sectional view along the axis BB of FIG. 3. The AA axis diagonally cuts the green optical filters V. The BB axis is an axis perpendicular to the AA axis and cuts, outside the diagonals, successive blue B, green V, red R, green V, blue B, green V, red R, etc. optical filters.

The image sensor comprises a photosensitive semiconducting element 1, for example silicon, on which a first metal layer m1, a first transparent layer d1, a second metal layer m2 and a second transparent layer d2 are successively laid. The metal used for producing the metal layers m1 and m2 is silver (Ag) for example and the material used for producing the transparent layers d1 and d2 is a dielectric for example, which may be titanium dioxide ($TiO_2$) for example.

The layer d1 is an adjustment layer, the change in thickness of which changes the different transmission wavelengths of the filter, all the other layers having constant thickness. The change in thickness of the layer d1 is thus adapted to selective transmission of the blue color (thickness e1), of the green color (thickness f1) and of the red color (thickness g1).

In the particular case when the metal layers m1 and m2 are silver layers (Ag) and the transparent layers d1 and d2 are titanium dioxide ($TiO_2$) layers, the thicknesses of the layers m1, m2 and d2 are equal, for example to 27 nm, 36 nm and 41 nm, respectively and the thickness of the layer d1 varies between 50 nm and 90 nm, i.e.: 52 nm for blue, 70 nm for green, 87 nm for red.

The thicknesses of the layers would assume different values with other materials. As non-limiting examples, the metal layers may be made with Ag, Al, Au, Nb, Li and the transparent layers may be made with $TiO_2$, ITO, $SiO_2$, $Si_3N_4$, $MgF_2$, SiON, $Al_2O_3$, $HfO_2$. Generally, the thicknesses of the layers m1, d1, m2, d2 are calculated with algorithms for multilayer filter calculations.

It should be noted here that, in FIGS. 4A and 4B (and this is the same for the whole of the other figures), the thickness of the layer is deliberately enlarged so as to better view the changes in thickness.

Figure 5:
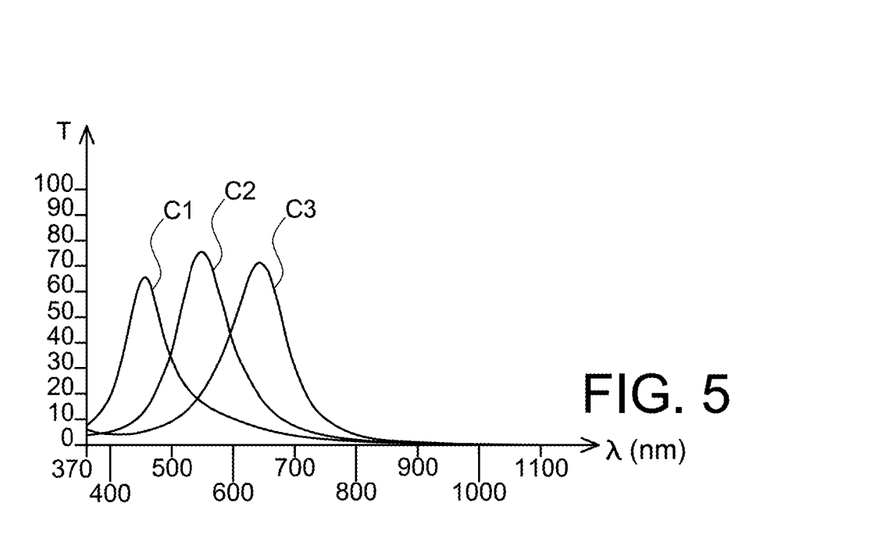
FIG. 5 illustrates the performances of optical filtering of an optical filtering matrix structure according to the first embodiment of the invention described in patent application Ser. No. 12/373,832.

FIG. 5 illustrates the optical filtering performances of a filtering matrix structure according to the first embodiment of the invention described in patent application Ser. No. 12/373,832. Three curves are illustrated in FIG. 5, i.e. a transmission curve C1 relative to the blue color (for blue filters), a transmission curve C2 relative to the green color (for green filters) and a transmission curve C3 relative to the red color (for red filters). The curves C1, C2, C3 illustrate the transmission coefficient of the matrix structure expressed as percentages depending on the wavelength $\lambda$ expressed in nm.

Not only the excellent quality of the transmission results obtained with only four layers (a transmission attaining substantially 70%), should also be noted here but also the excellent rejection of infrared waves beyond 900 nm.

Moreover, the optical filters only show one transmission peak between the near ultraviolet (400 nm) and infrared (1100 nm). This is also an advantage as compared with the dielectric structures of the prior art which already have parasitic transmission in the near infrared (>800 nm).

Figure 6A:
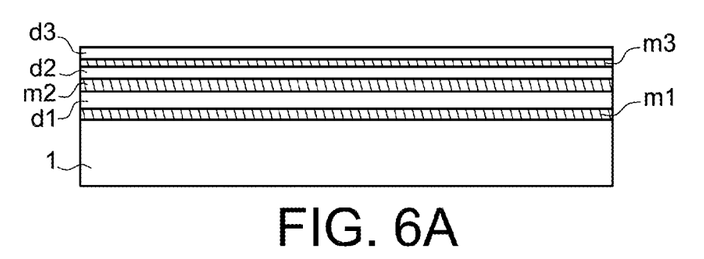
FIGS. 6A and 6B illustrate sectional views along two different axes of an optical filtering matrix structure according to a second embodiment of the invention described in patent application Ser. No. 12/373,832.
Figure 6B:
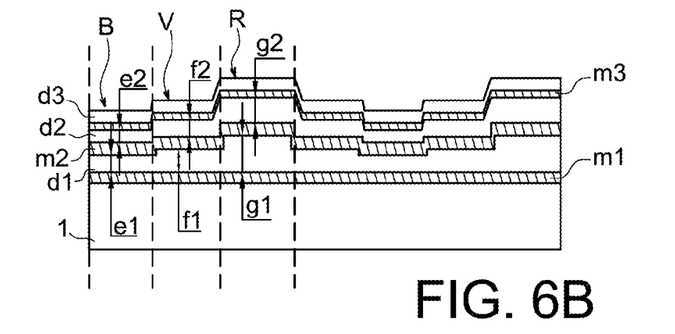

FIGS. 6A and 6B illustrate sectional views, along two different axes of an optical filtering matrix structure according to a second embodiment of the invention described in patent application Ser. No. 12/373,832. With reference to FIG. 3, FIG. 6A is a sectional view along the AA axis and FIG. 6B is a sectional view along the BB axis.

The image sensor comprises a photosensitive semiconducting element 1, for example silicon, on which three metal layers m1, m2, m3 and three transparent layers d1, d2, d3 are alternately laid, the metal layer m1 being in contact with the semiconducting element 1. The metal layers m1-m3 are in silver (Ag) for example, and the transparent layers d1-d3 are in titanium dioxide ($TiO_2$) for example.

The layers d1 and d2 are adjustment layers, of which the changes in thickness set the different transmission wavelengths of the filter, all the other layers having a constant thickness. An overthickness resulting from a change in thickness of the layer d1 coincides with an overthickness resulting from a change in thickness of the layer d2 (the overthicknesses are stacked). The layer d3 is an antireflection layer. The changes in thickness of the layers d1 and d2 are thus adapted to selective transmission of the different colors:

a thickness e1 of the layer d1 and a thickness e2 of the layer d2 are associated for selective transmission of the blue color;

a thickness f1 of the layer d1 and a thickness f2 of the layer d2 are associated for selective transmission of the green color; and a thickness g1 of the layer d1 and a thickness g2 of the layer d2 are associated for selective transmission of the red color.

In the particular case of metal layers in silver (Ag) and of transparent layers in titanium dioxide ($TiO_2$), the thicknesses of the layers m1, m2, m3 and d3 are for example equal to 23 nm, 39 nm, 12 nm and 65 nm, respectively, the thicknesses of the layers d1 and d2 being comprised between 50 nm and 100 nm, i.e.:

|  | $d_1$ | $d_2$ |
| --- | --- | --- |
| Blue | 52 nm | 51.4 nm |
| Green | 70 nm | 73.5 nm |
| Red | 87.5 nm | 96 nm |

Figure 7:
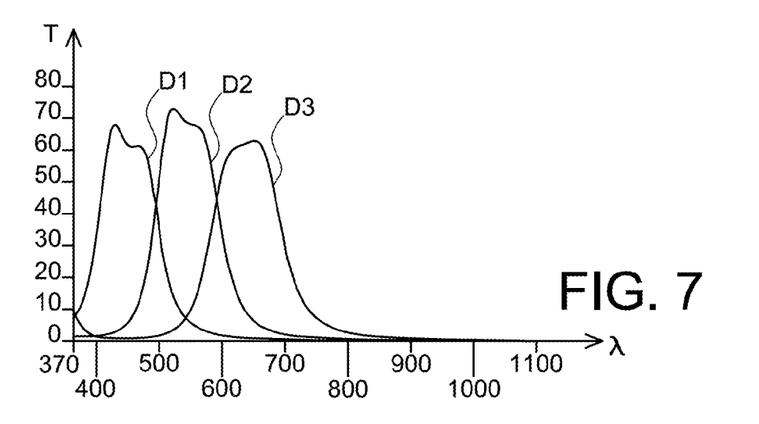
FIG. 7 illustrates the optical filtering performances of an optical filtering matrix structure according to the second embodiment of the invention described in patent application Ser. No. 12/373,832.

The transmission spectrum resulting from this matrix structure is illustrated in FIG. 7. The curves D1, D2, D3 represent the transmission coefficient T of the matrix structure expressed as percentages depending on the wavelength $\lambda$ expressed in nm. At the central wavelengths which correspond to the three desired colors (red, green, blue), transmission is substantially comprised between 60 and 70%.

Figure 8:
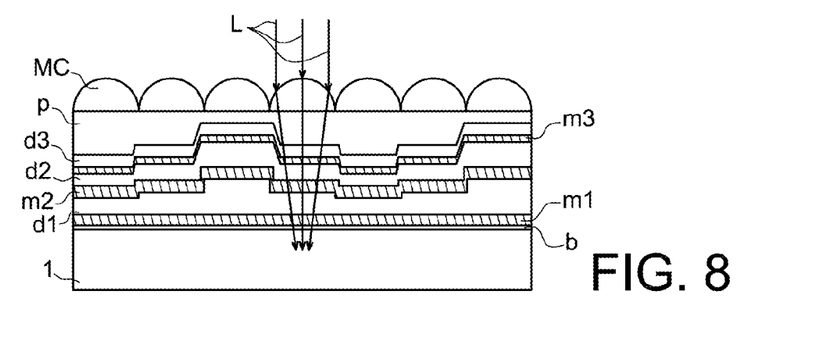
FIG. 8 illustrates a sensor block sectional view which uses an optical filtering matrix structure according to the second embodiment of the invention described in patent application Ser. No. 12/373,832.

FIG. 8 illustrates a sectional view of an enhancement of an optical filtering matrix structure according to the second embodiment of the invention described in patent application Ser. No. 12/373,832. The matrix structure is here equipped with a set of micro-lenses MC which focus the light L in the photosites. In a way known per se, the MC micro-lenses are placed on a planarization layer p.

In addition to the elements already described with reference to FIGS. 6A and 6B, the set of micro-lenses MC and the planarization layer p, the matrix structure of the invention here comprises a barrier layer b which protects the semiconductor 1 from the metal layer m1. The barrier layer b then prevents the semiconductor 1 from being contaminated by the metal layer m1 (pollution by migration of metal ions into the semiconductor). In the case when, for example, the metal is silver (Ag), with a silica barrier layer or a layer of indium-doped tin oxide (ITO) (Indium Tin Oxide) the desired protection may be achieved. The thickness of the silica layers or of ITO is, for example, equal to 10 nm.

The barrier layer b may be non-conducting (this is the case of silica $SiO_2$ and of silicon nitride $Si_3N_4$), conducting (this is the case of ITO) or partly conducting. When it is conducting, the barrier layer b may advantageously be used as an electrode at the surface of the semiconductor 1. Advantageously, in the case when the barrier layer is an ITO barrier, ITO may also be used for making the transparent layers of the structure, ITO being transparent. The layers b, d1, d2, d3 are then in ITO and the layers m1, m2, m3 are in Ag. Two materials (Ag and ITO) are then sufficient for making the structure according to the invention in which the photosensitive semiconductor is protected from a contact with metal. It is also possible to replace the silver with a less contaminating metal alloy for the semiconductor but still having good index properties. The metal alloy and ITO are then also sufficient for making a structure according to the invention, in which the photosensitive semiconductor is protected.

Figure 9:
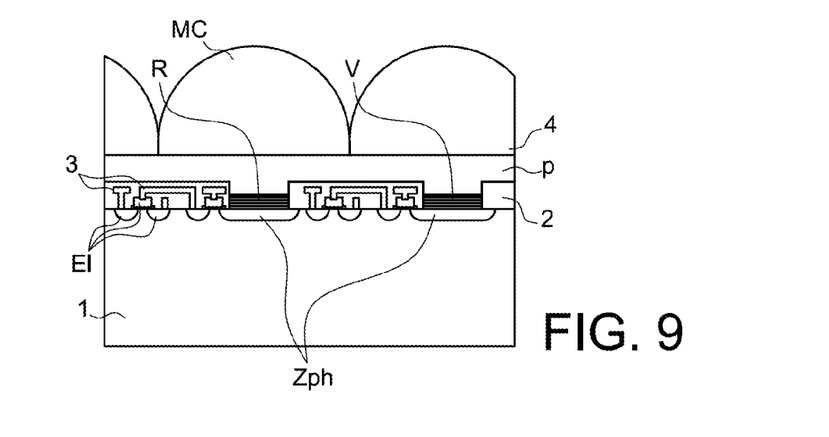
FIG. 9 illustrates a first alternative sensor according to the invention described in patent application Ser. No. 12/373,832.
Figure 10:
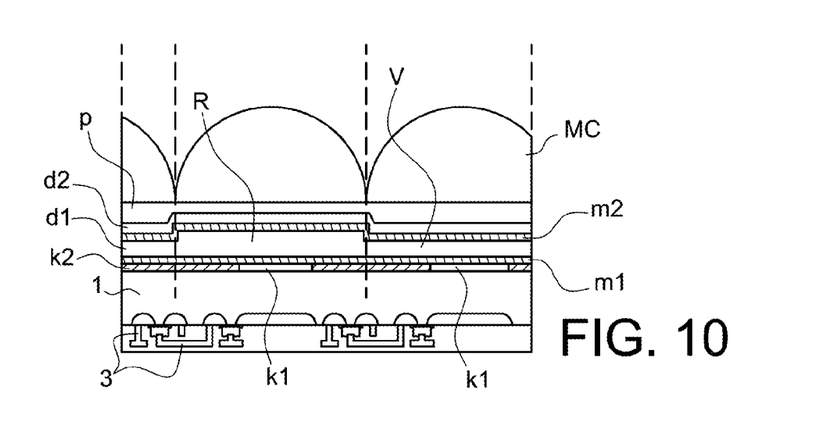
FIG. 10 illustrates a first alternative sensor according to the invention described in patent application Ser. No. 12/373,832.

FIGS. 9 and 10 illustrate two alternative optical sensors according to the invention described in patent application Ser. No. 12/373,832.

FIG. 9 illustrates an optical sensor in which light arrives on the face of the photosensitive semiconductor on which the photosensitive areas Zph and electronic circuits E1 are formed. In this type of optical sensor, light should avoid the metal interconnections 3. The optical filters of the invention are generally much thinner than the filters of the prior art. It is then advantageous to place the filters as close as possible to the photosensitive areas Zph, between the interconnections 3. Comparatively to the corresponding structure of the prior art (cf. FIG. 2), the optical sensor accordingly has better insensitivity to the incidence of the light.

FIG. 10 illustrates an optical sensor in which light arrives on the face of the photosensitive semiconductor which is opposite to the face on which the photosensitive areas Zph and the electronic circuits E1 are formed. The optical filtering matrix of the invention is very easily adapted to this type of sensor. Here also, the optical sensor of the invention has an advantageously smaller thickness than a corresponding optical sensor of the prior art. Moreover, in certain applications, the proximity of the optical filters advantageously allows the micro-lenses MC to be suppressed.

According to a particular embodiment, the sensor illustrated in FIG. 10 comprises, between the semiconductor 1 and the first metal layer m1, a barrier layer b provided with electrically conducting areas k1 and electrically insulating areas k2. The conducting k1 and insulating k2 areas enable electric contact to be established at the desired locations.

The two particular structures illustrated in FIGS. 9 and 10 advantageously have a transmission spectrum which varies very little with the angle of incidence of the light. Thus, for example, a green filter ($TiO_2$/Ag) having a filter bandwidth of 90 nm has its average wavelength vary by substantially 20 nm when the incidence varies from 0° to 40° Comparatively, this change would be 38 nm for a multilayer filter of the prior art ($SiO_2$/$TiO_2$).

Another advantage of the filtering structures of the invention is that they may be made with materials such as silver and ITO which are electric conductors, so that the filter may play the role of an electrode, this electrode being able to have several points of contact with the underlying circuit (El, Zph).

Technological making of the filtering structures and of the sensors of the invention is rather simple and makes use of usual manufacturing processes from the field of micro-electronics.

Preferentially, the transparent layers and the metal layers are made by vacuum sputtering but other techniques are also possible such as for example vacuum evaporation. Control of the thickness is accomplished by knowing the rate of the depositions.

The method for making an exemplary optical filtering structure with a single transparent layer of variable thickness is described hereafter.

On a photosensitive semiconducting substrate are successively deposited a protective layer ($SiO_2$), a metal layer (silver) and a transparent material layer (ITO). Two steps of photolithography-etching are then carried out. Masking of the areas which should not be etched is made with resin. Etching is accomplished, preferably, as a reactive ionic etching (for example under chlorine+HBr gases for etching ITO). The point for stopping the etching is determined by an interferometer. As a non-limiting example, from an ITO layer with a thickness of 90 nm, it is possible to obtain an ITO thickness of 70 nm for green, 50 nm for blue, the initial thickness of 90 nm being kept for red. A silver layer (Ag) and an ITO layer each having a constant thickness, are then deposited successively.

The method for making an exemplary optical filtering structure with two transparent layers of variable thicknesses is described hereafter.

The method is almost identical with the one described above for a single transparent layer of variable thickness, i.e.:

depositing three first layers (protective $SiO_2$ layer, first Ag layer, first ITO layer);

carrying out two photolithography-etching steps for producing the transparent steps of the first ITO layer;

depositing the two following layers (second Ag layer, second ITO layer);

carrying out two new photolithography-etching steps for producing the transparent steps of the second transparent layer;

depositing the two last layers of constant thickness (Ag, ITO).

As this has already been mentioned earlier, advantageously, the invention provides that the protective layer may be more complicated to produce than a simple dielectric layer. For example, if the intention is to use an elementary filter as a conducting electrode, then it is mandatory to replace the insulating protective layer with a conducting protective layer at the locations where the protective layer is in electric contact with the photosensitive semiconductor.

Producing such a layer with two materials, for example $SiO_2$ for producing the insulating areas and ITO for producing the conducting areas, is conducted in four steps, i.e.:

depositing a SiO$_2$ layer;

photolithography and etching of SiO$_2$ where the intention is to put ITO;

depositing an ITO layer a little thicker than the SiO$_2$ layer;

mechano-chemical planarization removing ITO as far as the surface of the SiO$_2$. FIGS. 11A and 11B illustrate a top view of an optical filtering matrix of the present invention.

As mentioned above in relation to the optical filtering matrix of the invention obtained with four layers (cf. page 12 of the present description) not only the excellent quality of the transmission results should be noted (transmission attaining substantially 70%), but also the excellent rejection of infrared waves beyond 900 nm.

Figure 11:
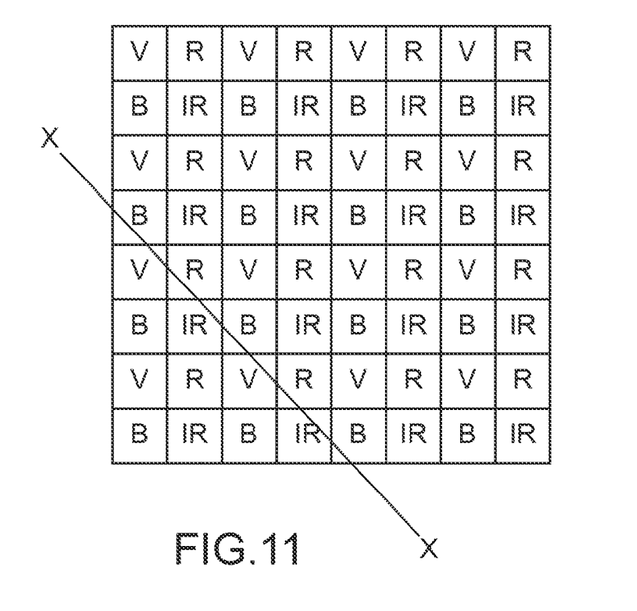
FIG. 11 illustrates a top view of an example of a filtering matrix structure according to the present invention.

Due to these advantageous features, it is possible to carry out a filtering matrix comprising near Infra-Red filtering pixels in addition to the three color filtering pixels blue, green and red. An elementary pattern is then, for example, made of four pixels organized in the form of a Bayer matrix wherein a green pixel is replaced with a near Infra-Red pixel. FIG. 11 illustrates, as an example, a Bayer type matrix of the invention.

However, the invention relates also to pixel configurations different from the Bayer type configuration and which contain different types of pattern. Moreover, the invention also relates to pixel configurations in which the color filters are not necessarily blue, green or red filters. Indeed, the invention relates to a filtering matrix structure having at least three different color filters (not necessarily blue, green or red) and a near Infrared filter. In the present description, the different embodiments of the invention are described with the color filters blue, green and red for commodity reasons.

Figure 12:
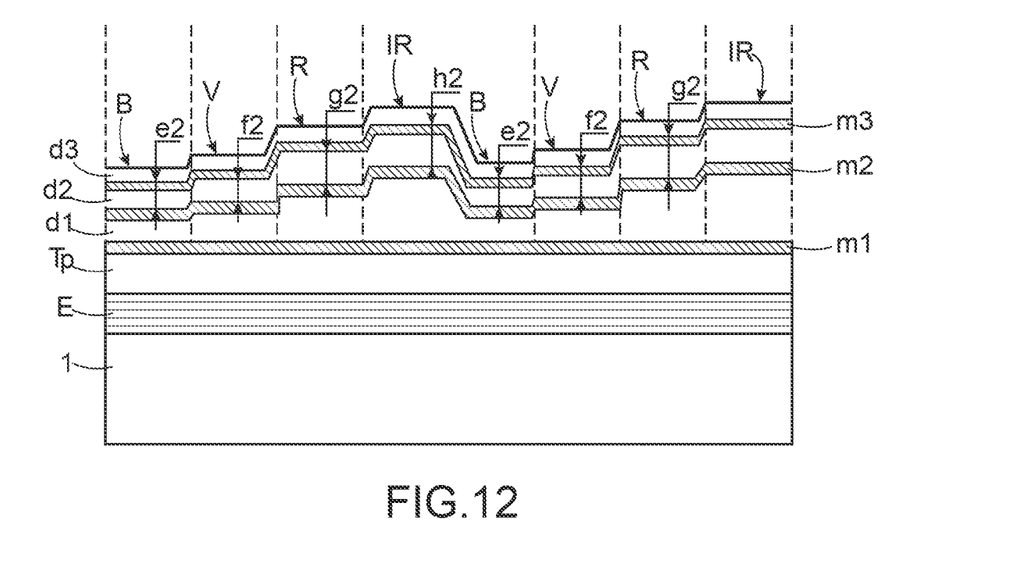
FIG. 12 illustrates a sectional view of a filtering matrix structure according to the present invention.

The FIG. 12 illustrates a cross-sectional view along the axis XX of the FIG. 11A. The axis XX cuts successive pixels blue B, green V, red R, near Infra-red IR, blue B, green V, red R, near Infra-Red IR, etc.

The image sensor comprises a photosensitive element 1, a set of protective layers E, a dielectric layer Tp and three metal layers m1, m2, m3 alternating with three transparent layers d1, d2, d3, the metal layer m1 being in contact with the dielectric layer Tp. The set of protective layers E is intended to avoid the deterioration of the electrical properties of the photodiodes of the image sensor. Also, the set of protective layers E may include interconnection layers carrying metallic lines allowing getting the electrical signals from the photodiodes out of the chip. The set of protective layers E is optional (see, for example, the device of the FIG. 4B). The dielectric layer Tp is intended to improve the potential transmittance of the filter, i.e. to reduce the reflection of light on the photosensitive element 1. This dielectric layer Tp is also optional (see, for example, the device of the FIG. 4B). Preferentially, each layer d1, d2 is made of two different materials.

Below, the Table 1 gives, as an example, the different material and the different thicknesses of the different layers of the matrix of FIG. 12, from the layer Tp to the layer d3.

TABLE 1

| Layer →Material | Pixel | | | |
|---|---|---|---|---|
| | Blue | Green | Red | IR |
| T → Al(Cu)N | 63 nm | 63 nm | 63 nm | 63 nm |
| m1 → Ag | 25 nm | 25 nm | 25 nm | 25 nm |
| → Al(Cu)N | 60 nm | 60 nm | 60 nm | 60 nm |
| d1 | | | | |
| → SiN | 0 | 22 nm | 38 nm | 88 nm |
| m2 → Ag | 25 nm | 25 nm | 25 nm | 25 nm |
| → Al(Cu)N | 60 nm | 60 nm | 60 nm | 60 nm |
| d2 | | | | |
| → SiN | 0 | 22 nm | 42 nm | 97 nm |
| m3 → Ag | 20 nm | 20 nm | 20 nm | 20 nm |
| d3 → SiN | 84 nm | 84 nm | 84 nm | 84 nm |

Figure 13:
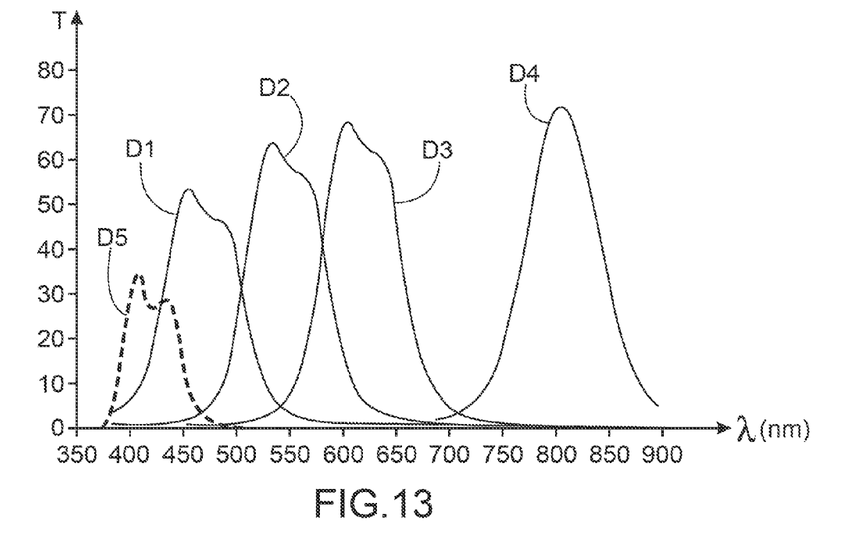
FIG. 13 illustrates the optical filtering performances of the filtering matrix structure illustrated in FIGS. 11 and 12.

The FIG. 13 illustrates the filtering performances of a filtering matrix structure according to FIG. 12. The transmission coefficient T is expressed as percentages depending on the wavelength expressed in nm. The three curves D1, D2, D3 correspond respectively to the three curves C1, C2 and C3 of FIG. 5. In the FIG. 13, the curve D4 and D5 relate to the filtering performance of the near Infra-Red pixel. The curve D4 corresponds to the near Infrared transmission and the curve D5 relates to a parasitic transmission near the blue color which is not critical for a good working of the filtering matrix.

If necessary, the doping of the semiconductor material in the infrared pixels can be modified to avoid photogeneration of charges following absorption in the blue.

Figure 14:
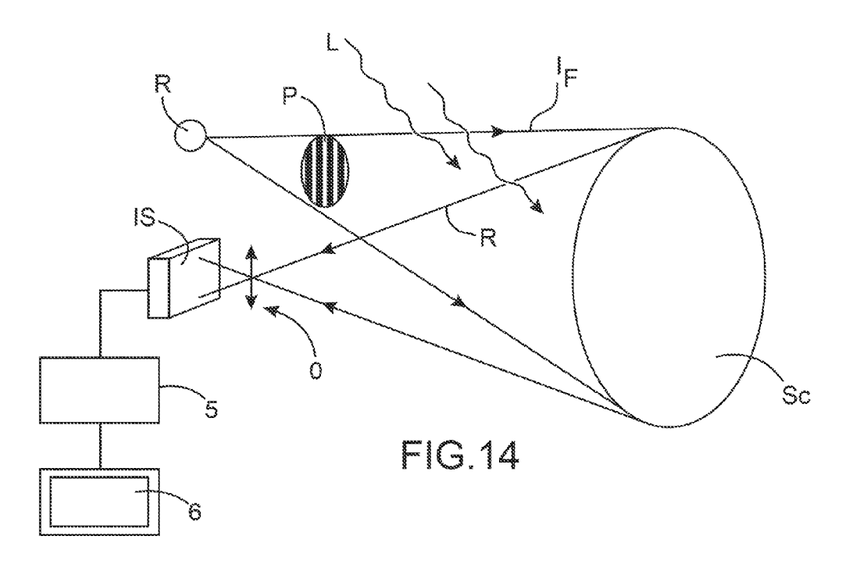
FIG. 14 illustrates a device able to get simultaneously a colored image and a depth map of a scene according to the present invention.

The FIG. 14 illustrates a three-dimensional (3D) mapping and imaging device able to get simultaneously a colored image and a depth map of a scene according to the present invention.

The 3D mapping and imaging device comprises a near infrared source S, a device P which produces patterned or structured light, an optical device O, an image sensor IS in accordance with the present invention, a processing device 5 and a display 6. The image sensor IS comprises a filtering matrix M in accordance with the present invention (as illustrated, for example, in FIG. 12), and photosensitive areas (as illustrated, for example, in FIG. 9 or 10). The device P is made, for example, of straight lines and the near infrared source S is made, for example, of Light Emitting Diodes (LEDs). Any other device P allowing to produce patterned or structured light may be used as, for example, the devices disclosed in the document entitled "Fringe Projection Techniques: Whither we are?" (authors: Sai Siva Gorthi and Pramod Rastogi/*Preprint submitted to Optics and Lasers in Engeneering*/Sep. 1, 2009).

The near infrared source S emits a near infrared light $I_F$ towards a scene Sc, through the pattern P. Otherwise the scene is lighted by some visible light L (natural or artificial). The light R reflected by the scene Sc passes through the optical device O (for example an optical lens) and is detected by the image sensor IS. The reflected light R comprises a near infrared component and a visible light component which are detected by the image sensor IS. The processing device 5 is configured to process the signals output from the image sensor IS and to generate and output a depth map and a color image of the scene which are simultaneously displayed on the display 6.

The invention claimed is:

1. A filtering matrix structure comprising at least three different color filters and a plurality of near Infrared filters, each one of the different color filters and the near Infrared filters having an optimum transmission frequency, wherein the filtering matrix structure is made of n metal layers (m1, m2, m3) and n substantially transparent layers (d1, d2, d3) which alternate between a first metal layer (m1) and an $n^{th}$ substantially transparent layer (d3), each of the n metal layers (m1, m2, m3) having a constant thickness and at least one substantially transparent layer having a variable thickness which sets the optimum transmission frequency of each color filter and each near Infrared filter, n being an integer larger than or equal to 2.

2. The filtering matrix structure according to claim 1, wherein n=2 and wherein a single substantial transparent layer has the variable thickness, the substantially transparent layer which has a variable thickness being the substantially transparent layer located between the first metal layer (m1) and a second metal layer (m2).

3. The filtering matrix structure according to claim 1, wherein n=3 and wherein two substantially transparent layers have a variable thickness, a first substantially transparent layer which has a variable thickness being the substantially transparent layer located between the first metal layer (m1) and a second metal layer (m2) and the second substantially transparent layer which has a variable thickness being located between the second metal layer and a third metal layer (m3), an overthickness resulting from a change in thickness of the first substantially transparent layer substantially stacked with an overthickness resulting from a change in thickness of the second substantially transparent layer.

4. The filtering matrix structure according to claim 1, wherein the different color filters are Red, Green and Blue filters.

5. The filtering matrix structure according to claim 4, wherein the Red, Green and Blue filters and the near Infrared filters are arranged in a form of a Bayer matrix wherein the near Infrared filters replace 50% of the Green filters.

6. The filtering matrix structure according to claim 1, wherein the metal layers are in silver (Ag).

7. The filtering matrix structure according to claim 1, wherein a material which makes up the substantially transparent layers is selected from titanium dioxide ($TiO_2$), indium-doped tin oxide (ITO), silica ($SiO_2$), silicon nitride ($Si_3N_4$), hafnium oxide ($HfO_2$), . . . (Al(Cu)N), . . . , (SiN).

8. An image sensor comprising the filtering matrix and a photosensitive semiconducting substrate (1) on which is deposited the filtering matrix structure, wherein the filtering matrix structure is the structure according to any of claims 1 to 7, the first metal layer (m1) being deposited on a first face of the photosensitive semiconducting substrate.

9. An image sensor comprising the filtering matrix structure according to any of claims 1 to 7, a photosensitive semiconducting substrate (1) and a barrier layer (b), a first face of the barrier layer (b) being in contact with the first metal layer (m1) and a second face of the barrier layer opposite to the first face being in contact with a face of the photosensitive substrate (1).

10. The image sensor according to claim 9, wherein the barrier layer (b) is made in a material identical with the material which makes up the substantially transparent layers of the filtering matrix structure.

11. The image sensor according to claim 9, wherein the barrier layer (b) is partly or totally electrically conducting.

12. The image sensor according to claim 11, wherein the material of the barrier layer is indium-doped tin oxide (ITO) in the electrically conducting portions and silica ($SiO_2$) or silicon nitride ($Si_3N_4$) in the portions which are not electrically conducting.

13. An image sensor comprising the filtering matrix structure according to any of claims 1 to 7, a photosensitive semiconducting substrate (1) and a dielectric layer (Tp), a first face of the dielectric layer (Tp) being in contact with the first metal layer (m1) and a second face of the dielectric layer (Tp) opposite to the first face being in contact with a face of the photosensitive substrate (1).

14. The image sensor according to claim 8, wherein photosensitive areas (Zph) and electronic components (El) are formed on the first face of the photosensitive semiconducting substrate.

15. The image sensor according to claim 8, wherein photosensitive areas (Zph) and electronic components (El) are formed on a second face of the photosensitive semiconducting substrate opposite to the first face.

16. A 3D mapping and imaging device comprising a near Infrared source (S) emitting a near Infrared light ($I_F$), a device (P) for producing patterned or structured light through which the near Infrared light passes before reaching an object, and an image sensor configured to capture both some visible light reflected by the object and some near Infrared light reflected by the object, wherein the image sensor is the image sensor according to any claims 8 to 15.

* * * * *